United States Patent

Liang et al.

[11] Patent Number: 5,923,974
[45] Date of Patent: Jul. 13, 1999

[54] METHOD OF MANUFACTURE OF MEMORY DEVICE WITH HIGH COUPLING RATIO

[75] Inventors: Mong-Song Liang; Ching-Hsiang Hsu, both of Hsin-chu; Ruei-Ling Lin, Kaohsiung, all of Taiwan

[73] Assignee: Taiwan Semiconductor Manufacturing Company, Hsin-Chu, Taiwan

[21] Appl. No.: 08/939,970

[22] Filed: Sep. 29, 1997

[51] Int. Cl.[6] .................. H01L 21/8246; H01L 21/8247
[52] U.S. Cl. ..................... 438/257; 438/260; 438/261
[58] Field of Search .......................... 257/321, 314–324; 438/257–264

[56] References Cited

U.S. PATENT DOCUMENTS

| 5,554,544 | 9/1996 | Hsu | 437/35 |
| 5,556,799 | 9/1996 | Hong | 437/43 |
| 5,796,140 | 8/1998 | Tomioka | 257/321 |

OTHER PUBLICATIONS

Yosiaki S. Hisamune et al. "A High Capacitive Coupling Ratio (HiCR) Cell for 3V Only 64 Mbit and Future Flash Memories" (1993) *IEDM*, pp. 93–19–93–22.

*Primary Examiner*—Tom Thomas
*Assistant Examiner*—Cuong Quan Nguyen
*Attorney, Agent, or Firm*—George O. Saile; Stephen B. Ackerman; Graham S. Jones, II

[57] ABSTRACT

A method of forming a semiconductor memory device with a variable thickness gate oxide layer including a tunnel oxide layer and a thicker gate oxide layer includes the following steps. Provide a doped silicon semiconductor substrate coated with a tunnel oxide layer, a first floating gate conductor layer and a dielectric layer. Form a mask with an gate oxide opening through the mask. Etch through the gate oxide opening to form a gate oxide trench through the first polysilicon layer, the dielectric layer and the tunnel oxide layer down to the substrate. Form a gate oxide layer at the base of the gate oxide trench. Deposit a second floating gate conductor layer over the device on the exposed surfaces of the dielectric layer and down into the gate oxide trench including the gate oxide layer. Form a thin interelectrode dielectric layer upon the floating gate conductor layer. Deposit a control gate conductor layer over the device covering the device. Pattern the control gate conductor layer, the thin interelectrode dielectric layer, and the floating gate conductor layer down to the tunnel oxide layer. Form self-aligned source/drain regions in the substrate by a LATI method.

6 Claims, 4 Drawing Sheets

METHOD OF MANUFACTURE OF MEMORY DEVICE WITH HIGH COUPLING RATIO

BACKGROUND OF THE INVENTION

1. Field of the Invention

This invention relates to semiconductor memory devices and more particularly to flash memory devices with a high coupling ratio and a method of manufacture thereof.

2. Description of Related Art

In the current state of the art, contactless drain (buried diffusion) results in low read currents which is not suitable for high speed random access devices.

U.S. Pat. No. 5,556,799 of Hong for a "Process for Fabricating A Flash EEPROM" Hong teaches that as flash EEPROM devices are made with finer resolutions, floating gate surface areas shrink. This decreases the capacitance of the effective capacitor between the floating gate layer and the control gate layer. The unwanted decrease in effective capacitance results in a reduction in the coupling ratio, which is a parameter that describes the coupling to the floating gate of the voltage present at the control gate of the device. The poor coupling of voltage to a floating gate limits the programming and accessing speed of the flash EEPROM device.

U.S. Pat. No. 5,554,544 of Hsu shows a non-uniform gate oxide created by the field oxide. However, the method/structure differs from the present invention.

Yosiaki S. Hisamune, et al., "A High Capacitive-Coupling Ratio (HiCR) Cell For 3V Only 64 Mbit And Future Flash Memories", (1993) IEDM pp. 93–19 to 93–22 describes at page 93–19

"gate dielectrics consist of 20-nm thick thermal oxide grown on the channel region and 7.5-nm thick silicon oxynitride formed underneath the floating-gate sidewalls. The cell is designed to have ultra small tunneling regions (0.2 μm×0.4 μm) and a large floating gate area (1.4 μm×0.4 μm) in order to obtain the high capacitive-coupling ratio of 0.8. Here the capacitive coupling ratio $CR_E$ is defined by $$C_{RE} = \frac{C_{FG}}{C_T}$$

"where $C_{FG}$ is the capacitance of the interpoly oxide-nitride-oxide (ONO) dielectrics between the control gate and the floating gate and $C_T$ is the total capacitance of the floating gate."

SUMMARY OF THE INVENTION

An object of this invention is to achieve a high coupling ratio.

Another object of this invention is to provide a non-uniform gate oxide to a achieve a high coupling ratio.

A CMOS compatible process is provided which requires only one additional mask. There is a high coupling ratio due to the non-uniform gate oxide. In addition, a Large Angle Tilted Implant (LATI) process is employed to extend the N+ region to a thicker gate oxide.

In accordance with this invention, a method of forming a semiconductor memory device with a floating gate electrode, an interelectrode dielectric layer and a control gate electrode includes the following steps. Provide a doped silicon semiconductor substrate covered with variable thickness silicon oxide regions on the surface thereof. Form the floating gate electrode, the interelectrode dielectric layer and the control gate electrode over the device. Form the silicon oxide regions substantially thicker beneath the center of the location for the floating gate electrode. Then, form source/drain regions in the substrate extending beneath the tunnel oxide regions.

Preferably, the self-aligned source/drain regions in the substrate are formed by a LATI ion implantation process, the variable thickness silicon oxide regions comprise tunnel oxide regions on either side of a gate oxide region, the floating gate electrode being composed of doped polysilicon and includes reoxidized polysilicon dielectric regions formed in the floating gate electrode above the junctions of the tunnel oxide regions and the gate oxide region; the floating gate is formed with sections reaching down on either side of the reoxidized dielectric regions to the gate oxide region layer and to the tunnel oxide region layers; and/or the gate conductor layers are composed of doped polysilicon; the interelectrode dielectric layer is composed of ONO material; and/or the silicon oxide comprises a tunnel oxide layer with a thickness from about 80 Å to about 100 Å and a gate oxide layer with a thickness from about 150 Å to about 200 Å.

In accordance with another aspect of this invention, a method of forming a semiconductor memory device includes the following steps. Provide a doped silicon semiconductor substrate having alternating silicon oxide regions formed on the surface thereof. The alternating silicon oxide regions comprise alternating tunnel oxide layer regions and gate oxide layer regions formed on the surface of the substrate with the gate oxide region layers being substantially thicker than the tunnel oxide layer regions. Form a floating gate electrode centered over a the gate oxide region and over the tunnel oxide regions on either side of the gate oxide region. Form source/drain regions in the substrate extending beneath the tunnel oxide regions.

Preferably, the self-aligned source/drain regions in the substrate are formed by a LATI ion implantation process performed at an angle of about 45°; the floating gate electrode is composed of doped polysilicon and includes reoxidized polysilicon dielectric regions formed in the floating gate electrode above the junctions of the tunnel oxide regions and the gate oxide region; and/or the floating gate is formed with sections reaching down on either side of the reoxidized dielectric regions to the gate oxide region layer and to the tunnel oxide region layers.

In accordance with still another aspect of this invention, a method of forming a semiconductor memory device includes the following steps. Provide a doped silicon semiconductor substrate coated with a tunnel oxide layer, a first floating gate conductor layer and a dielectric layer. Form a mask with an gate oxide opening through the mask. Etch through the gate oxide opening to form a gate oxide trench through the first polysilicon layer, the dielectric layer and the tunnel oxide layer down to the substrate. Form a gate oxide layer at the base of the gate oxide trench. Deposit a second floating gate conductor layer over the device on the exposed surfaces of the dielectric layer and down into the gate oxide trench including the gate oxide layer. Form a thin interelectrode dielectric layer upon the floating gate conductor layer. Deposit a control gate conductor layer over the device covering the device. Pattern the control gate conductor layer, the thin interelectrode dielectric layer, and the floating gate conductor layer down to the tunnel oxide layer. Form self-aligned source/drain regions in the substrate.

Preferably, before forming the thin interelectrode dielectric layer etching back the second floating gate conductor layer below the surface of the dielectric layer, then stripping the dielectric layer and then forming a third floating gate over the second floating gate conductor layer and form the self-aligned source/drain regions in the substrate by a LATI ion implantation process performed at an angle of about 45°.

BRIEF DESCRIPTION OF THE DRAWINGS

The foregoing and other aspects and advantages of this invention are explained and described below with reference to the accompanying drawings, in which:

FIG. 1 shows a flash memory device in accordance with this invention in an early stage of manufacture with a silicon semiconductor substrate coated with a conventional tunnel oxide layer covered with a first polysilicon layer, a silicon nitride layer and a photoresist mask with windows therethrough.

FIG. 2 shows the device of FIG. 1 after patterning the silicon nitride layer by etching through openings in the mask to produce windows over portions of the first doped polysilicon layer; and after the photoresist mask has been stripped from the silicon nitride layer leaving it exposed with windows in the silicon nitride layer over portions of the first polysilicon layer.

FIG. 3 shows the device of FIG. 2 after the first polysilicon layer and tunnel oxide layer have been etched away beneath windows to produce slots therein below openings in FIG. 2.

FIG. 4 shows the device of FIG. 3 after a set of gate oxide regions were formed in and on the exposed surface of substrate linking the sections of the tunnel oxide layer.

FIG. 5 shows the device of FIG. 4 after a second polysilicon conductor layer has been formed in a blanket deposition step covering the entire device.

FIG. 6 shows the device of FIG. 5 after the second polysilicon layer is etched back in thickness filling the slots formed as shown in FIG. 3 with convex shapes which are lowest between the silicon nitride/first polysilicon stacks.

FIG. 7 shows the device of FIG. 6 after the silicon nitride segments have been stripped away from the device leaving the second-polysilicon-layer stripes extending above the polysilicon reoxide silicon oxide sidewalls as well as the first polysilicon layer.

FIG. 8 shows the device of FIG. 7 after formation of a third polysilicon layer, a conventional ONO interconductor dielectric layer, a fourth polysilicon (word line) layer, and a photoresist mask (for patterning gate conductor stacks) with windows therethrough down to the surface of fourth polysilicon layer.

FIG. 9 shows the device of FIG. 8 after etching through the windows in photoresist mask down through the fourth polysilicon layer, the ONO layer, the third polysilicon layer and the first polysilicon layer to form spaces below the windows extending down to expose the surface of the substrate producing the gate conductor stacks.

FIG. 10 shows the device of FIG. 9 during a LATI ion implantation at an angle of 45° of arsenic ions into source/drain regions self-aligned with the gate conductor stacks by a rotary LATI ion implantation process to implant under the tunnel oxide.

DESCRIPTION OF THE PREFERRED EMBODIMENT

FIGS. 1–10 are sectional views showing the process of forming a device 10 in accordance with this invention.

Figure 1:
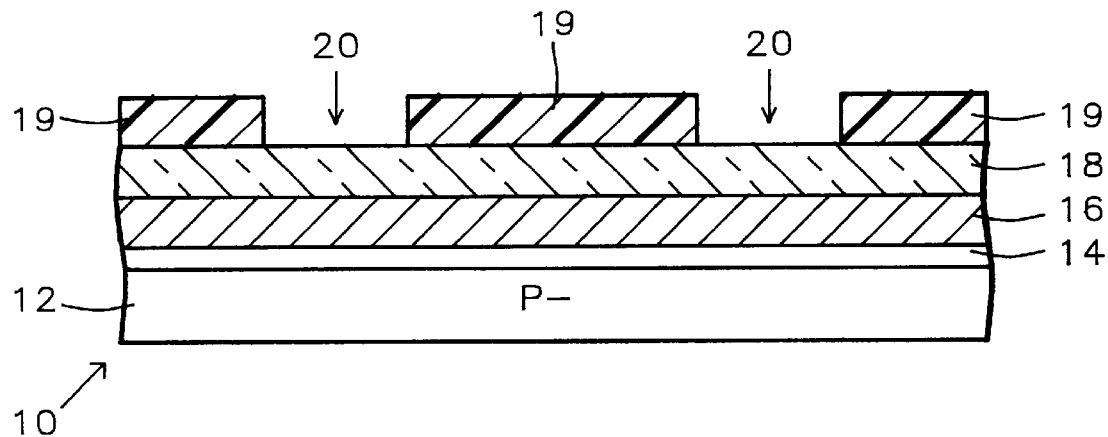
FIGS. 1–10 are sectional views showing the process of forming a device in accordance with this invention.

FIG. 1 shows the device 10 in accordance with this invention in an early stage of manufacture. A P− doped silicon semiconductor substrate 12 is coated with a conventional tunnel oxide layer 14. Alternatively, the substrate 12 can be an N− doped substrate or an N− well in a P− substrate depending upon product design choices; and the doped regions in FIG. 8 will be modified accordingly, as will be well understood by those skilled in the art.

The tunnel oxide layer 14, which is from about 80 Å to about 100 Å thick, is covered with a blanket layer of a first polysilicon (Poly I) conductor layer 16 (the initial floating gate layer) over the surface of tunnel oxide layer 14. The first polysilicon conductor layer 16 has a thickness of about 1,500 Å and layer 16 is formed by a CVD (Chemical Vapor Deposition) process of deposition from silane ($SiH_4$) gas mixed with nitrogen ($N_2$) gas in situ using phosphine ($PH_3$) gas for doping.

Next a silicon nitride ($Si_3N_4$) dielectric layer 18 from about 500 Å to about 1,000 Å thick is formed over the doped first polysilicon layer 16.

Then the first polysilicon layer 16 is patterned by forming a photoresist mask 19, with windows 20 therethrough, over the silicon nitride ($Si_3N_4$) layer 18.

Figure 2:
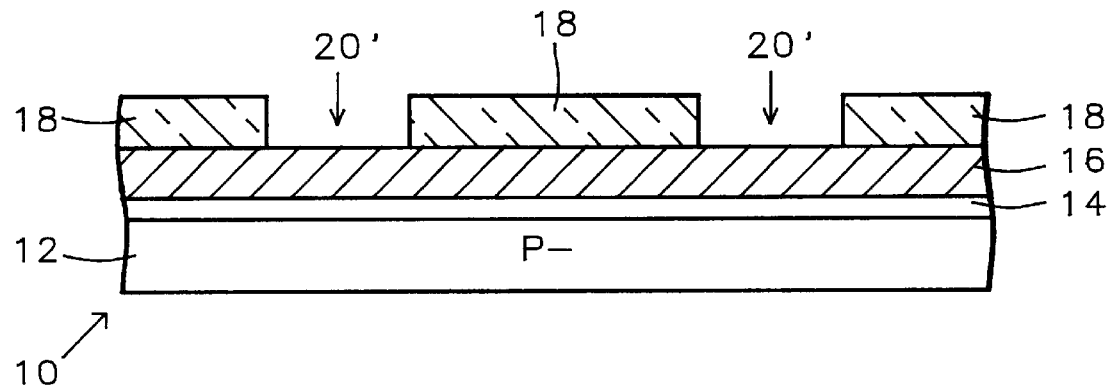

FIG. 2 shows the device 10 of FIG. 1 after patterning the silicon nitride ($Si_3N_4$) layer 18 by etching through openings 20 in mask 19 to produce windows 20' over portions of the first doped polysilicon layer 16; and after the photoresist mask 19 has been stripped from the silicon nitride ($Si_3N_4$) layer 18. Layer 18 remains exposed through the new windows 20 in silicon nitride layer 18 over portions of the first polysilicon layer 16.

Figure 3:
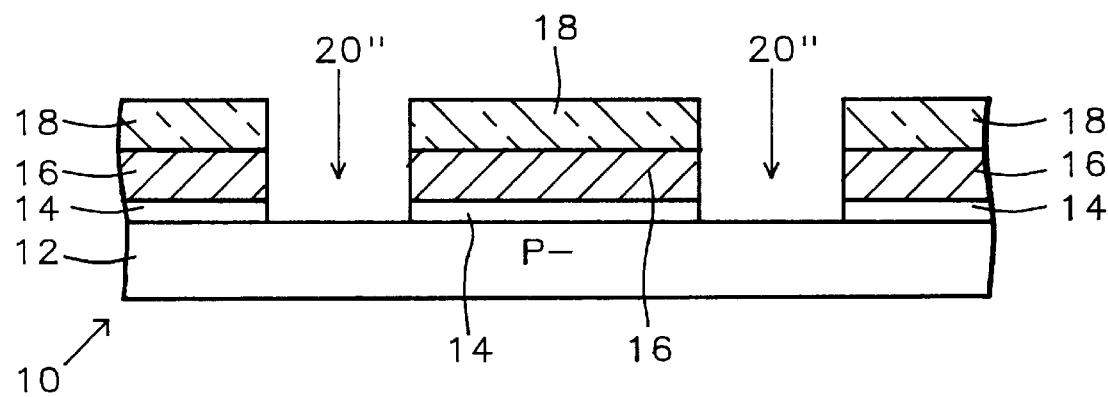

Referring to FIG. 3 device 10 of FIG. 2 is shown after etching through windows 20' to form slots 20" through layers 16 and 14 extending down through both first polysilicon layer 16 and tunnel oxide layer 14 below openings 20' in FIG. 2 to the top surface of substrate 12 of device 10.

Figure 4:
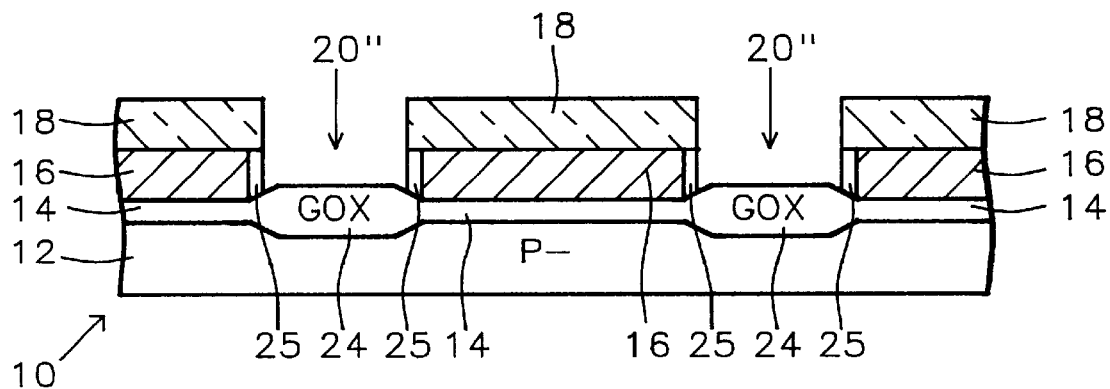

FIG. 4 shows the device 10 of FIG. 3 after a set of gate oxide (GOX) regions 24 were formed in and on the exposed surface of substrate 12 linking the sections of tunnel oxide (TOX) layer 14. The gate oxide regions 24 are from about 150 Å to about 200 Å thick. In addition, the edges of the first polysilicon layer 16 have been oxidized in a process known as "reoxidation" or "re-ox" to form reoxidized polysilicon (polysilicon reoxide) which will be referred to hereinafter as silicon oxide sidewalls 25 on the edge of the first polysilicon layer 16. The gate oxide regions 24 and the silicon oxide sidewalls 25 were formed by a conventional process of thermal oxidation.

Figure 5:
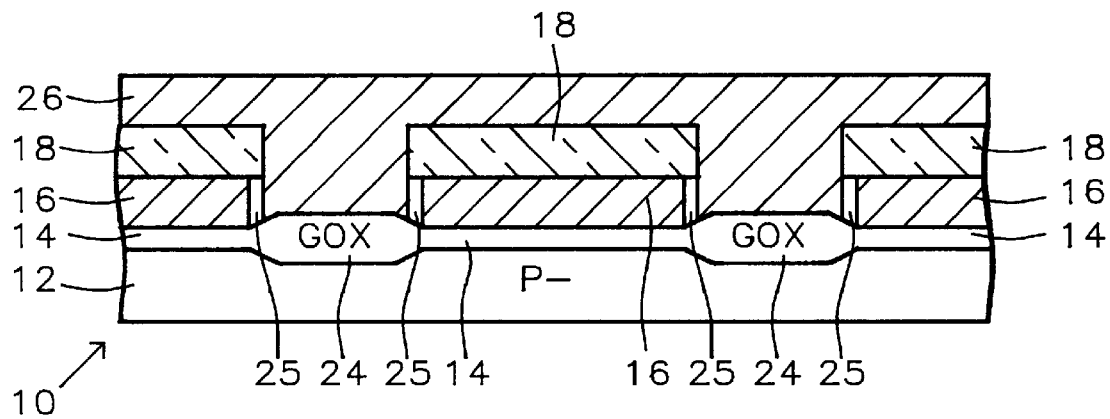

FIG. 5 shows the device 10 of FIG. 4 after a second doped polysilicon (Poly II) conductor layer 26 has been formed in a blanket deposition step covering the entire device 10 from about 3,000 Å to about 7,000 Å thick and filling slots 20" between the silicon oxide sidewalls 25. Second polysilicon layer 26 is formed by a CVD (Chemical Vapor Deposition) process of deposition from silane ($SiH_4$) gas, nitrogen ($N_2$) gas in situ using phosphine ($PH_3$) gas for doping.

Figure 6:
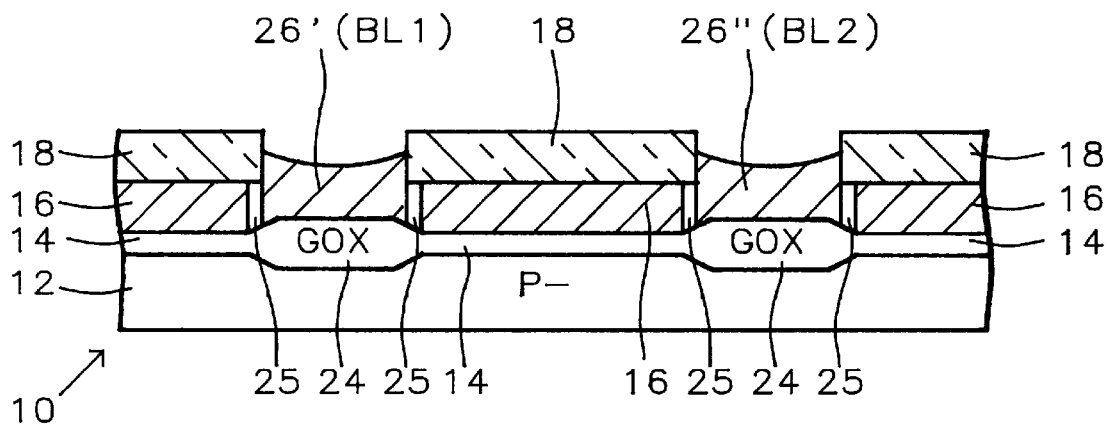

FIG. 6 shows the device 10 of FIG. 5 after the second polysilicon layer 26 is etched back to a thickness from about 1,500 Å to about 3,000 Å thick to fill the slots 20" (formed as shown in FIG. 3) with polysilicon patterned into convex shapes which are lower than the silicon nitride/first polysilicon stacks 18/16. The layers 26 are located between stacks 25/18/16 (silicon oxide sidewalls 25, silicon nitride layer 18 and first polysilicon layer 16).

Figure 7:
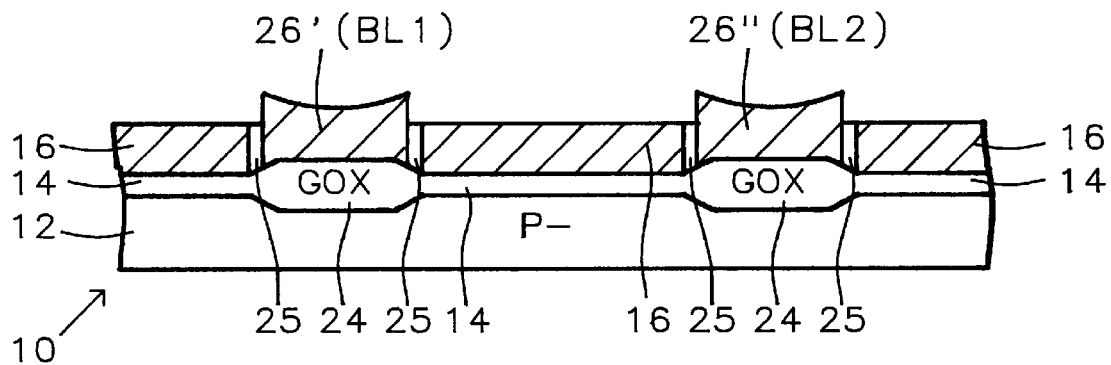

FIG. 7 shows the device 10 of FIG. 6 after the silicon nitride segments 18 have been stripped away from device 10 leaving the second polysilicon stripes 26 extending above the silicon oxide sidewalls 25 as well as reaching higher above the surface of the substrate 12 than the first polysilicon layer 16.

Figure 8:
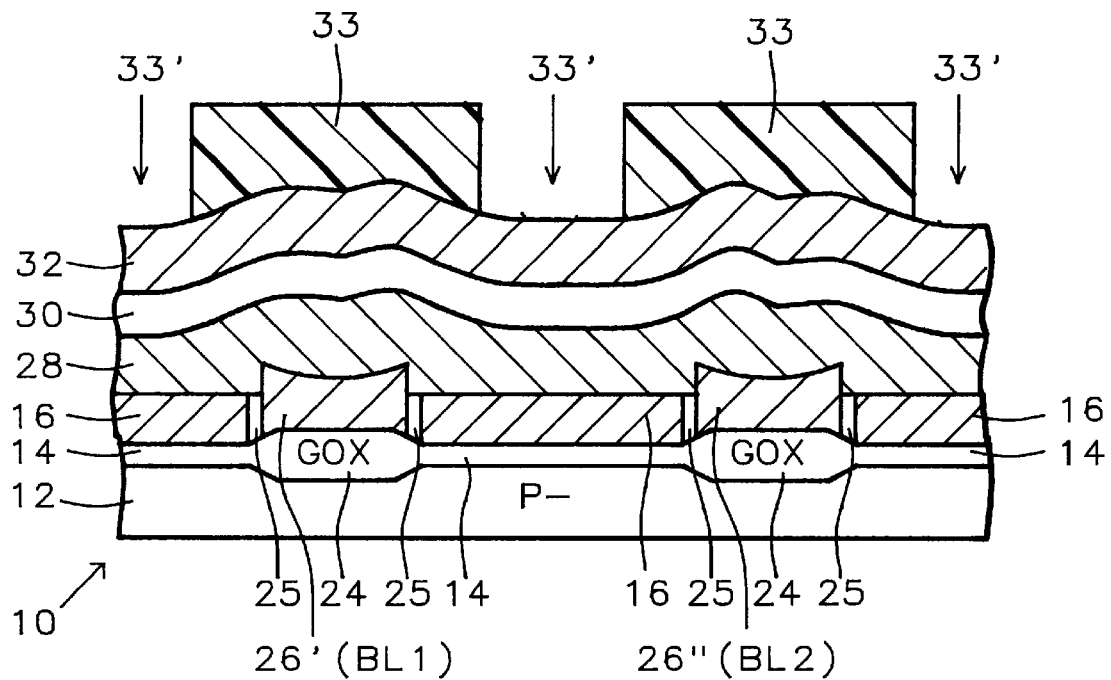

FIG. 8 shows the device of FIG. 7 after formation of a third polysilicon (Poly III) layer 28, a conventional ONO interconductor dielectric layer 30, a fourth polysilicon (Poly IV) word line layer 32, and a photoresist mask 33 (for patterning gate conductor stacks). Photoresist mask 33 has windows 33' therethrough extending down to the top surface of fourth polysilicon layer 32.

Third polysilicon layer 28 was formed from about 500 Å to about 1,000 Å thick by a CVD (Chemical Vapor Deposition) process of deposition from silane ($SiH_4$) gas, nitrogen ($N_2$) gas in situ using phosphine ($PH_3$) gas for doping.

The ONO interconductor dielectric layer 30 preferably consists of Oxide Nitride Oxide (ONO) with a thickness of about 60 Å of silicon Oxide, a thickness of about 40 Å of silicon Nitride, and a thickness of about 60 Å of silicon Oxide which was deposited in a conventional manner.

Fourth polysilicon layer 32 was formed about 1,500 Å thick by a CVD (Chemical Vapor Deposition) process of deposition from silane ($SiH_4$) gas, nitrogen ($N_2$) gas in situ using phosphine ($PH_3$) gas for doping.

Figure 9:
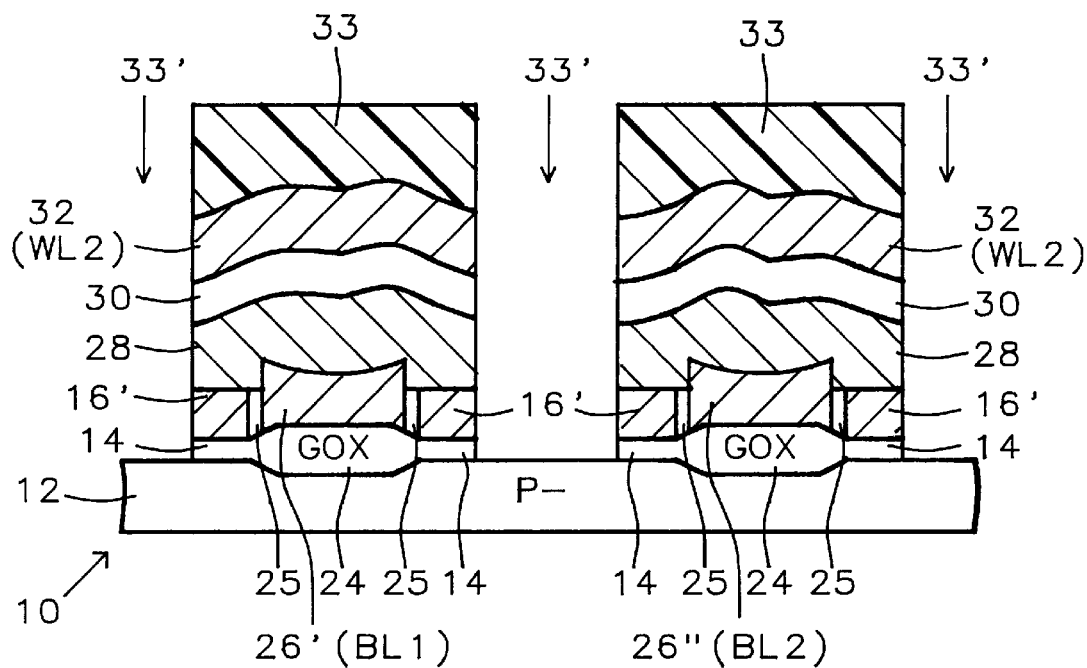
Figure 10:
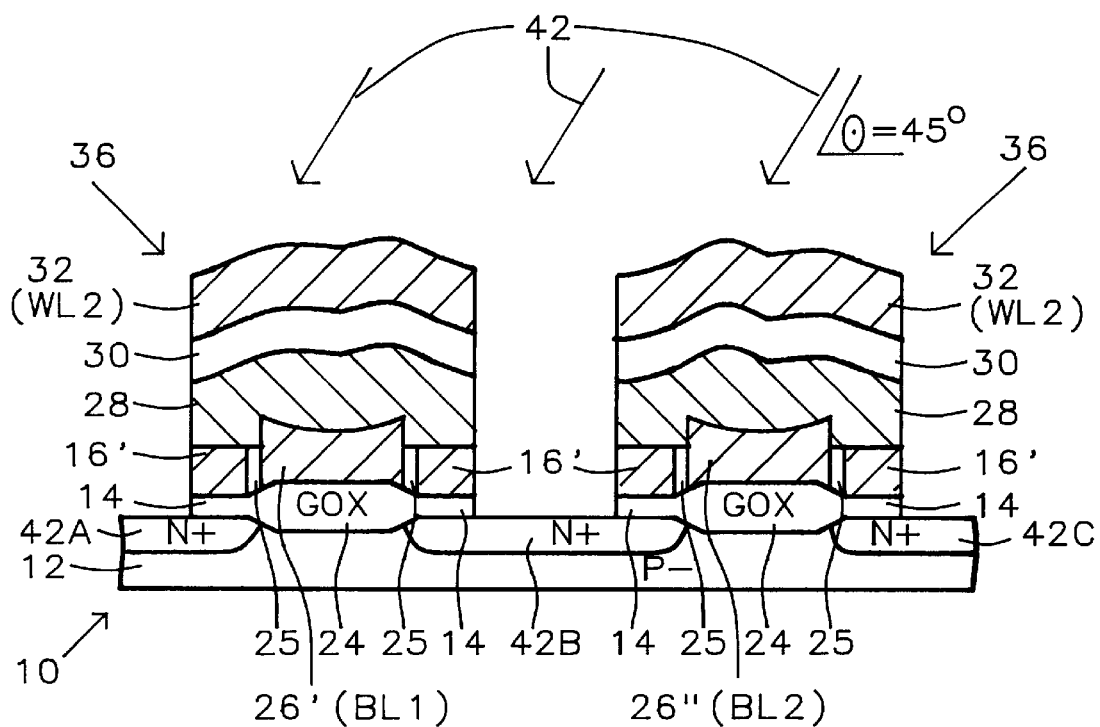

FIG. 9 shows the device of FIG. 8 after etching through windows 33' in photoresist mask 33 down through the fourth polysilicon layer 32, ONO layer 30, third polysilicon layer 32 and first polysilicon layer 16 to form spaces below the windows 33' extending down to expose the surface of substrate 12 producing the gate conductor stacks 36. The stacks 36 include the floating gates composed of first polysilicon layer 16, second polysilicon layer 26, and third polysilicon layer 28. Above the floating gates, are the ONO regions 30 on which the control gates are formed by fourth polysilicon layer 32.

Advantages

1. The process of this invention produces a device with a high Coupling Ratio (CR) achieved by a non-uniform gate oxide.

COUPLING RATIO $$CR = \frac{C_{FG}}{C_T}$$

where $C_{FG}$ the capacitance between the floating gate and the control gate $C_T$ Total capacitance.

2. The Large Tilted Angle Implant (LATI) process is used to extend the N+ dopant regions to the thicker gate oxide in order to reduce band-to-ban tunneling leakage current.

3. The invention is CMOS compatible with an additional mask.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a semiconductor memory device with a floating gate electrode, an interelectrode dielectric layer and a control gate electrode including the steps as follows:

providing a doped silicon semiconductor substrate with a surface covered with a tunnel oxide layer, forming a blanket, doped, first polysilicon layer having a top over said tunnel oxide layer, forming a first dielectric layer with a top surface over said top of said first polysilicon layer, forming a first mask with a window therethrough over said first dielectric layer, etching through said window to pattern said first dielectric layer extending said window down through said first dielectric layer to expose said first polysilicon layer and stripping away said first mask, etching through said window to remove material therebelow in said first polysilicon layer and said tunnel oxide layer down to extend said window down to expose a portion of said surface of said silicon semiconductor substrate thereby exposing sidewalls of said first dielectric layer and said first polysilicon layer, forming a gate oxide region on said portion of said surface of said silicon semiconductor substrate and forming reoxidation regions on said sidewalls of said first polysilicon layer, said gate oxide region having an exposed surface at the bottom of said window, and forming reoxidation regions on said sidewalls of said first polysilicon layer, said gate oxide region having an exposed surface at the bottom of said window, forming a blanket, doped, second polysilicon layer over said first dielectric layer extending down into said windows onto said gate oxide region and onto said sidewalls of said first dielectric layer and said reoxidation regions on said sidewalls of said first polysilicon layer, etching back said second polysilicon layer below said top surface of said first dielectric layer to a level above said top of said first polysilicon layer, stripping away those portions of said first dielectric layer which remain to expose said top of said first polysilicon layer, said reoxidation regions, and sidewalls of said second polysilicon layer, forming a blanket, third polysilicon layer over said top of said first polysilicon layer, said reoxidation regions, and said second polysilicon layer, forming an interpolysilicon dielectric layer and a fourth polysilicon layer successively above said third polysilicon layer, forming a second mask over said third polysilicon layer, said second mask being used for patterning a gate conductor stack above said gate oxide region by etching away portions of said fourth polysilicon layer, said interpolysilicon dielectric layer, said third polysilicon layer, said second polysilicon layer, and said tunnel oxide layer exposed through openings in said second mask to expose said surface of said substrate on either side of said gate oxide layer thereby forming said floating gate electrode, said interpolysilicon dielectric layer and said control gate electrode over said device centered over said gate oxide region, said floating gate electrode being formed by said third polysilicon layer which remains, said second polysilicon layer which remains, and said first polysilicon layer which remains with said second polysilicon layer which remains connecting said first layer portion which remains to said second layer portion which remains, forming self-aligned source/drain regions below exposed portions of said substrate with said source drain regions extending beneath said tunnel oxide layer.

2. The method in accordance with claim 1 wherein:

said self-aligned source/drain regions in said substrate are formed by a LATI ion implantation process.

3. The method in accordance with claim 1 wherein:

said self-aligned source/drain regions in said substrate are formed by a LATI ion implantation process performed at an angle of about 45°.

4. The method in accordance with claim 1 wherein:

said interelectrode dielectric layer is composed of ONO material.

5. The method in accordance with claim 1 wherein:

said interelectrode dielectric layer is composed of ONO material, and said silicon oxide comprises a tunnel oxide layer with a thickness from about 80 Å to about 100 Å and a gate oxide layer with a thickness from about 150 Å to about 200 Å.

6. A method of forming a semiconductor memory device with floating gate electrode, an interelectrode dielectric layer and a control gate electrode including the steps as follows:

providing a doped silicon semiconductor substrate with a surface covered with a tunnel oxide layer, forming a blanket, doped, first polysilicon layer having a top over said tunnel oxide layer, forming a first dielectric layer with a top surface over said top of said first polysilicon layer, forming a first mask with a window therethrough over said first dielectric layer, etching through said window to pattern said first dielectric layer extending said window down through said first dielectric layer to expose said first polysilicon layer and stripping away said first mask, etching through said window to remove material therebelow in said first polysilicon layer and said tunnel oxide layer down to extend said window down to expose a portion of said surface of said silicon semiconductor substrate thereby exposing sidewalls of said first dielectric layer and said first polysilicon layer, forming a gate oxide region on said portion of said surface of said silicon semiconductor substrate, said gate oxide region being substantially thicker than said tunnel oxide layer and being located beneath the center of the location for said floating gate electrode, forming reoxidation regions on said sidewalls of said first polysilicon layer, said gate oxide region having an exposed surface at the bottom of said window, forming a blanket, doped, second polysilicon layer over said first dielectric layer extending down into said windows onto said gate oxide region and onto said sidewalls of said first dielectric layer and said reoxidation regions on said sidewalls of said first polysilicon layer, etching back said second polysilicon layer below said top surface of said first dielectric layer to a level above said top of said first polysilicon layer, stripping away those portions of said first dielectric layer which remain to expose said top of said first polysilicon layer, said reoxidation regions, and sidewalls of said second polysilicon layer, forming a blanket, third polysilicon layer over said top of said first polysilicon layer, said reoxidation regions, and said second polysilicon layer, forming an interpolysilicon dielectric layer and a fourth polysilicon layer successively above said third polysilicon layer, said interelectrode dielectric layer is composed of ONO material, forming a second mask over said third polysilicon layer, said second mask being used for patterning a gate conductor stack above said gate oxide region by etching away portions of said fourth polysilicon layer, said interpolysilicon dielectric layer, said third polysilicon layer, said second polysilicon layer, and said tunnel oxide layer exposed through openings in said second mask to expose said surface of said substrate on either side of said gate oxide layer thereby forming said floating gate electrode, said interpolysilicon dielectric layer and said control gate electrode over said device centered over said gate oxide region, said floating gate electrode being formed by said third polysilicon layer which remains, said second polysilicon layer which remains, and said first polysilicon layer which remains with said second polysilicon layer which remains connecting said first layer portion which remains to said second layer portion which remains, forming source/drain regions below exposed portions of said substrate with said source drain regions extending beneath said tunnel oxide layer, said self-aligned source/drain regions in said substrate are formed by a LATI ion implantation process performed at an angle of about 45°, and said tunnel oxide layer has a thickness from about 80 Å to about 100 Å and a gate oxide region has a thickness from about 150 Å to about 200 Å.

* * * * *